US012621578B2

(12) United States Patent
Lenchenkov et al.

(10) Patent No.: US 12,621,578 B2
(45) Date of Patent: May 5, 2026

(54) HYPERSPECTRAL SENSOR WITH DIFFRACTIVE FOCUSING ELEMENTS AND COLOR FILTERS

(71) Applicant: SONY SEMICONDUCTOR SOLUTIONS CORPORATION, Kanagawa (JP)

(72) Inventors: Victor A. Lenchenkov, Victor, NY (US); Frederick T. Brady, Rochester, NY (US); Gui Gui, Rochester, NY (US); Trevor O'Loughlin, Rochester, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 75 days.

(21) Appl. No.: 18/614,386

(22) Filed: Mar. 22, 2024

(65) Prior Publication Data

US 2025/0301234 A1     Sep. 25, 2025

(51) Int. Cl.
| | |
|---|---|
| *H04N 25/13* | (2023.01) |
| *G01J 3/18* | (2006.01) |
| *G01J 3/51* | (2006.01) |
| *H10F 39/00* | (2025.01) |
| *H10F 39/18* | (2025.01) |

(52) U.S. Cl.
CPC ................ *H04N 25/13* (2023.01); *G01J 3/18* (2013.01); *G01J 3/51* (2013.01); *H10F 39/182* (2025.01); *H10F 39/8053* (2025.01); *H10F 39/8063* (2025.01); *H10F 39/8067* (2025.01)

(58) Field of Classification Search
CPC .... H04N 25/13; G01J 3/18; G01J 3/51; H10F 39/182; H10F 39/8053; H10F 39/8063; H10F 39/8067
See application file for complete search history.

(56) References Cited

U.S. PATENT DOCUMENTS

| | | | | |
|---|---|---|---|---|
| 3,971,065 | A | 7/1976 | Bayer | |
| 7,242,478 | B1 * | 7/2007 | Dombrowski | ........ G01J 3/2823 |
| | | | | 356/419 |
| 8,274,739 | B2 | 9/2012 | Lee et al. | |

(Continued)

FOREIGN PATENT DOCUMENTS

| | | |
|---|---|---|
| JP | 2015-095879 | 5/2015 |

OTHER PUBLICATIONS

U.S. Appl. No. 17/983,656, filed Nov. 9, 2022, Lenchenkov.

(Continued)

*Primary Examiner* — Jason A Flohre
(74) *Attorney, Agent, or Firm* — SHERIDAN ROSS P.C.

(57) ABSTRACT

Color image sensors and systems are provided. A sensor as disclosed includes a plurality of color sensing pixels disposed within an array, each of which includes a plurality of sub-pixels. Each color sensing pixel within the image sensor is associated with a set of diffraction features and a plurality of wavelength selective filters that only partially overlay an area of the pixel. The diffraction features can be formed from materials having an index of refraction that is higher than an index of refraction of the surrounding material. Color information regarding light incident on a pixel can be determined by applying ratios of signals obtained by pairs of included sub-pixels and calibrated ratios for different colors to a set of equations.

20 Claims, 14 Drawing Sheets

(56)                    References Cited

U.S. PATENT DOCUMENTS

| | | | |
|---|---|---|---|
| 8,330,840 | B2 | 12/2012 | Lenchenkov |
| 9,349,770 | B2 | 5/2016 | Lenchenkov |
| 11,385,104 | B2 | 7/2022 | Yao et al. |
| 2012/0248561 | A1 | 10/2012 | Hakko |
| 2014/0078355 | A1* | 3/2014 | Hiramoto ............... H04N 23/84 |
| | | | 250/208.1 |
| 2016/0003994 | A1 | 1/2016 | Gill et al. |
| 2018/0131882 | A1* | 5/2018 | Nam ...................... H04N 25/57 |
| 2018/0233530 | A1 | 8/2018 | Lenchenkov et al. |
| 2019/0348453 | A1* | 11/2019 | Lee ........................ H04N 25/00 |
| 2020/0173911 | A1 | 6/2020 | Kojima et al. |
| 2021/0126030 | A1 | 4/2021 | Yun et al. |
| 2021/0266431 | A1 | 8/2021 | Lenchenkov |
| 2021/0352248 | A1 | 11/2021 | Masagaki |
| 2022/0239840 | A1* | 7/2022 | Lenchenkov ............ G02B 7/34 |
| 2022/0271081 | A1* | 8/2022 | Chao ................... H04N 25/772 |
| 2023/0387160 | A1 | 11/2023 | Lenchenkov |
| 2024/0063240 | A1 | 2/2024 | Lenchenkov |
| 2024/0363656 | A1* | 10/2024 | Masuda ................ H10F 39/804 |

OTHER PUBLICATIONS

U.S. Appl. No. 17/983,680, filed Nov. 9, 2022, Lenchenkov.
U.S. Appl. No. 18/235,991, filed Aug. 21, 2023, Lenchenkov.
U.S. Appl. No. 18/601,553, filed Mar. 11, 2024, Lenchenkov et al.

* cited by examiner

904 — Select wavelength

908 — Expose pixel to light of selected wavelength

912 — Pass light through diffractive element and color filter layers

916 — Determine and record sub-pixel output values

920 — Other wavelengths?

Start

End

Yes

No

HYPERSPECTRAL SENSOR WITH DIFFRACTIVE FOCUSING ELEMENTS AND COLOR FILTERS

FIELD

The present disclosure relates to an imaging device incorporating diffractive, light focusing elements and color filters to enable accurate recovery of incident light wavelength from noisy signals.

BACKGROUND

Digital image sensors are commonly used in a variety of electronic devices, such as handheld cameras, security systems, telephones, computers, and tablets, to capture images. In a typical arrangement, light sensitive areas or pixels are arranged in a two-dimensional array having multiple rows and columns of pixels. Each pixel generates an electrical charge in response to receiving photons as a result of being exposed to incident light. For example, each pixel can include a photodiode that generates charge in an amount that is generally proportional to the amount of light (i.e. the number of photons) incident on the pixel during an exposure period. The charge can then be read out from each of the pixels, for example through peripheral circuitry.

In conventional color image sensors, absorptive color filters are used to enable the image sensor to detect the color of incident light. The color filters are typically disposed in sets (e.g. of red, green, and blue (RGB); cyan, magenta, and yellow (CMY); or red, green, blue, and infrared (RGBIR)), with one color filter in the set over one light sensitive pixel. Such arrangements have about 3-4 times lower sensitivity and signal to noise ratio (SNR) at low light conditions, experience issues with color crosstalk and color shading at high chief ray angles (CRA), and have lower spatial resolution due to color filter patterning resulting in lower spatial frequency as compared to monochrome sensors without color filters. However, such limitations have been endured in order to obtain information about the color or wavelength of the light incident on the image sensor.

Image sensors have been developed that utilize uniform, non-focusing metal gratings, to diffract light in a wavelength dependent manner, before that light is absorbed in a silicon substrate. Such an approach enables the wavelength characteristics (i.e. the color) of incident light to be determined, without requiring the use of absorptive filters. However, the non-focusing diffractive grating results in light loss before the light reaches the substrate. Such an approach also requires an adjustment or shift in the microlens and the grating position and structures across the image plane to accommodate high chief ray angles (CRAs).

Still other sensor systems that enable color to be sensed without the use of color filters are so called "color routers", which direct light among a 2×2 Bayer array of red, green, green, and blue pixels. In such systems, instead of using absorptive filters to select the light that is incident on the individual pixels, the light is routed to the pixels within the Bayer array on the basis of color by high index of refraction diffractive elements. Although this avoids the loss inherent to absorptive filter designs, the resulting color resolution of the sensor is the same as or similar to that of a filter based Bayer array. In addition, determining the pattern of the diffractive elements used to route the light of different colors requires the use of artificial intelligence design procedures, and results in a relatively tall structure.

Improved color or wavelength sensitive systems have been developed that utilize sets of diffractive, light focusing elements disposed over pixels that each include a plurality of sub-pixels. In such arrangements, the diffraction pattern produced across the sub-pixels of a wavelength sensing pixel is different for different wavelengths of incident light. These systems have the potential to provide high color resolution and sensitivity. However, the ability of such systems to accurately determine a wavelength of incident light can be compromised in real world situations, in which the outputs from the sub-pixels include noise components. This problem is particularly apparent in systems seeking to provide high spectral resolution by incorporating a relatively large number of sub-pixels within each wavelength sensing pixel.

Accordingly, it would be desirable to provide an image sensor with high sensitivity and high color resolution that could accurately determine a wavelength of incident light in the presence of noise.

SUMMARY

Embodiments of the present disclosure provide image sensors and image sensing methods that provide high color or wavelength resolution and sensitivity. An image sensor in accordance with embodiments of the present disclosure includes a sensor array having a plurality of color or wavelength sensing pixels. Each wavelength sensing pixel in the plurality of pixels includes a plurality of photosensitive sub-pixels formed within a sensor substrate. In addition, each wavelength sensing pixel is associated with a set of diffraction features. Each set of diffraction features includes a plurality of diffraction elements disposed in one or more layers on a light incident surface side of the sub-pixels of an associated wavelength sensing pixel. The diffraction elements can be formed from a transparent material having an index of refraction that is higher than an index of refraction of the material layer or substrate in which they are embedded. In addition, embodiments of the present disclosure include a plurality of wavelength selective filters, referred to herein as color filters, disposed on a light incident surface side of each of the wavelength sensing pixels.

Each set of diffraction features can include a plurality of diffraction elements disposed adjacent to a light incident surface of an associated wavelength sensing pixel. The individual diffraction elements can be configured as disks, cylinders, grating lines and/or other shapes distributed asymmetrically about the light incident surface of the pixel. The color filters can include filters of different wavelength bands. For example, the color filters associated with a color sensing pixel can include red, green, blue, cyan, magenta, and/or yellow filters. The diffraction features can be disposed between the color filters and the light incident surface of the sub-pixels. Alternatively, the color filters can be disposed between the diffraction features and the light incident surface of the sub-pixels.

The ratios of the signals generated in response to the incident light by the sub-pixels can then be used to determine the relative ratio of signal components of different wavelengths within that incident light. For example, the relative ratios of different wavelengths (or colors) included in the incident light can be determined by solving a matrix of three linear equations.

The interference pattern produced by the diffraction elements strongly correlates with the spectral content of the incident light. In particular, different diffraction patterns or wavelength fingerprints are produced across the sub-pixels of a color sensing pixels by the set of diffraction features associated with that pixel when exposed to light of different wavelengths. In addition, the inclusion of color filters improves the accuracy of the color sensing capabilities of the color sensing pixel by selectively filtering the incident light. The relative distribution and thus the fingerprint of the incident light across the light incident surface of the pixel is determined by comparing the output signals produced by the sub-pixels in response to the incident light. For example, in a configuration in which each pixel includes 25 sub-pixels, the 25 output signals enable 25 wavelength points to be recovered by solving a system of 25 linear equations using an inverse calibration matrix, where the calibration matrix is a 25×25 matrix constructed from the sub-pixel output signals. By including a number of color filters, the ability to accurately determine the wavelength of the incident light even in the presence of noise in the sub-pixel outputs is increased.

An imaging device or apparatus incorporating an image sensor in accordance with embodiments of the present disclosure can include an imaging lens that focuses collected light onto an image sensor. The light from the lens is focused and diffracted onto pixels included in the image sensor by transparent diffraction features. More particularly, each pixel includes a plurality of sub-pixels, and is associated with a set of diffraction features. The diffraction features function to create an asymmetrical diffraction pattern across the sub-pixels. Differences in the strength of the signals at each of the sub-pixels within a pixel can be applied to determine a color (i.e. a wavelength) of the light incident on the pixel.

Image sensing methods in accordance with embodiments of the present disclosure include focusing light collected from within a scene onto an image sensor having a plurality of pixels disposed in an array. The light incident on each pixel is focused and diffracted by a set of diffraction features onto a plurality of included sub-pixels, and is filtered by the color filters. The diffraction pattern produced by the diffraction features and the relative intensity of the light within the diffraction pattern on the different sub-pixels depends on the wavelength or spectrum of the incident light. Accordingly, the amplitude of the signal generated by the incident light at each of the sub-pixels in each pixel can be read to determine the wavelength of that incident light. In accordance with embodiments of the present disclosure, the assignment of a wavelength to light incident on a pixel includes reading output signals from the sub-pixels included in the pixel and solving a system of equations using calibrated ratios. The amplitude or intensity of the light incident on the pixel is the sum of all of the signals from the sub-pixels included in that pixel. An image sensor produced in accordance with embodiments of the present disclosure does not require micro lenses for each pixel or color filters, and provides high sensitivity over a range that can be coincident with the full wavelength sensitivity of the image sensor pixels.

More particularly, methods for sensing a wavelength of light in accordance with embodiments of the present disclosure include collecting light from an object space and focusing the collected light onto an image sensor that includes a plurality of wavelength sensitive pixels, referred to herein simply as pixels, with each of the pixels including a plurality of sub-pixels. For each of the pixels, light incident thereon is directed past a set of diffraction elements and past a set of color or wavelength selective filters. The wavelength selective filters can be disposed in a plane, with different ones of the filters disposed over different portions or areas of a light incident surface of the associated pixel, and with other areas adjacent the light incident surface of the pixel not covered by any of the filters. The light incident on each wavelength selective pixel is diffracted by the diffraction elements, some of the light incident on each wavelength selective pixel is passed through a color filter, and other of the light incident on each wavelength selective pixel is not passed through a color filter. Different wavelengths of light incident on a pixel result in different, unique diffraction patterns or fingerprints across the sub-pixels of the pixel. Moreover, some of the diffracted light is filtered by a color filter. The resulting relative output of the sub-pixels of the pixel then provides an indication of the wavelength of the light incident on the pixel, as well as an indication of the intensity of the incident light.

Additional features and advantages of embodiments of the present disclosure will become more readily apparent from the following description, particularly when considered together with the accompanying drawings.

DETAILED DESCRIPTION

Figure 1:
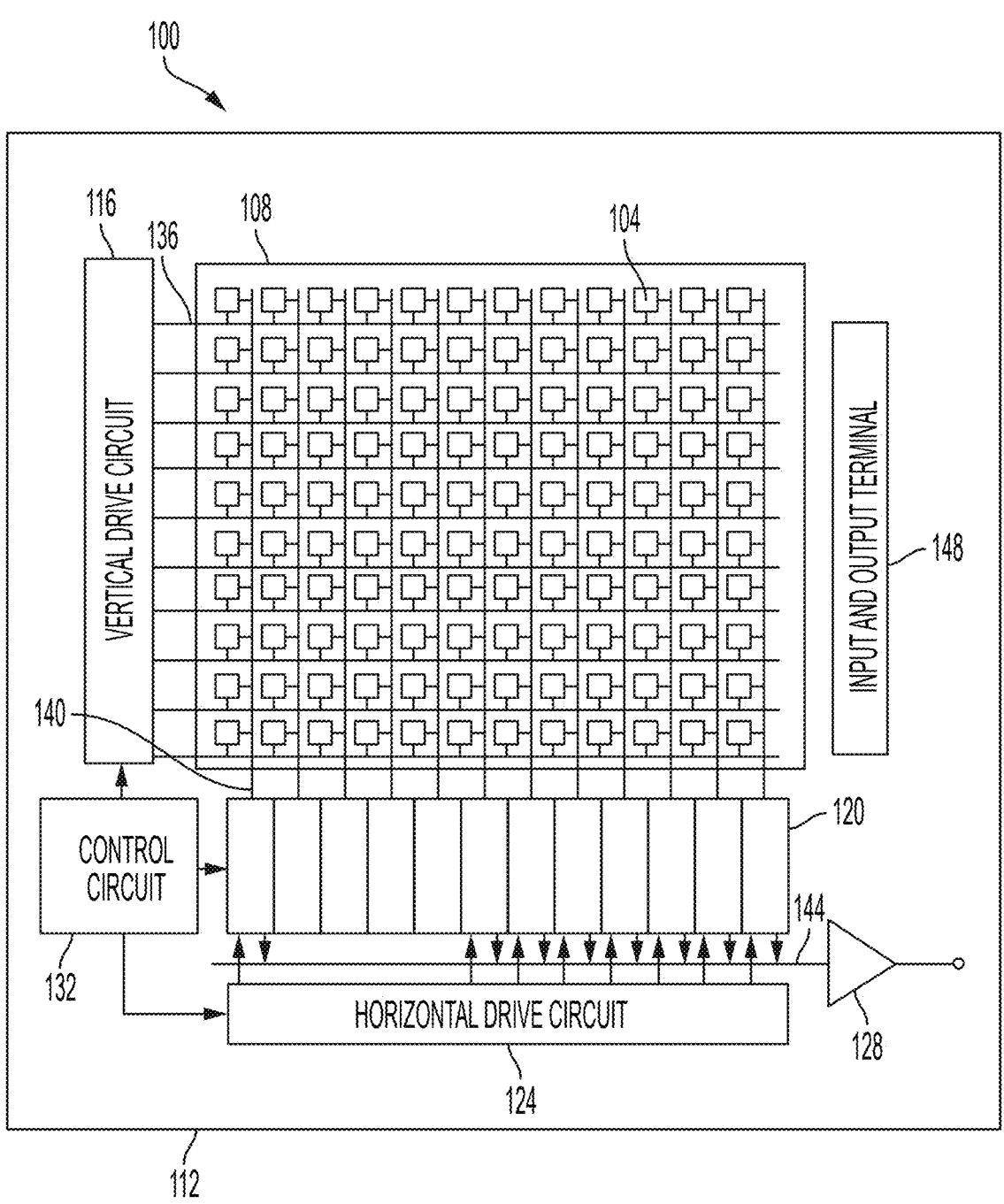
FIG. 1 depicts elements of a color sensing image sensor in accordance with embodiments of the present disclosure.

FIG. 1 is a diagram that depicts elements of a color sensing image sensor or device 100 in accordance with embodiments of the present disclosure. In general, the color sensing image sensor 100 includes a plurality of wavelength selective pixels, referred to herein simply as pixels 104, disposed in an array 108. More particularly, the pixels 104 can be disposed within an array 108 having a plurality of rows and columns of pixels 104. Moreover, the pixels 104 are formed in a sensor substrate 112. In addition, one or more peripheral or other circuits can be formed in connection with the sensor substrate 112. Examples of such circuits include a vertical drive circuit 116, a column signal processing circuit 120, a horizontal drive circuit 124, an output circuit 128, and a control circuit 132. As described in greater detail elsewhere herein, each of the pixels 104 within a color sensing image sensor 100 in accordance with embodiments of the present disclosure includes a plurality of photosensitive sites or sub-pixels.

The control circuit 132 can receive data for instructing an input clock, an operation mode, and the like, and can output data such as internal information related to the image sensor 100. Accordingly, the control circuit 132 can generate a clock signal that provides a standard for operation of the vertical drive circuit 116, the column signal processing circuit 120, and the horizontal drive circuit 124, and control signals based on a vertical synchronization signal, a horizontal synchronization signal, and a master clock. The control circuit 132 outputs the generated clock signal in the control signals to the various other circuits and components.

The vertical drive circuit 116 can, for example, be configured with a shift register, can operate to select a pixel drive wiring 136, and can supply pulses for driving sub-pixels of a pixel 104 through the selected drive wiring 136 in units of a row. The vertical drive circuit 116 can also selectively and sequentially scan elements of the array 108 in units of a row in a vertical direction, and supply the signals generated within the pixels 104 according to an amount of light they have received to the column signal processing circuit 120 through a vertical signal line 140.

The column signal processing circuit 120 can operate to perform signal processing, such as noise removal, on the signal output from the pixels 104. For example, the column signal processing circuit 120 can perform signal processing such as a correlated double sampling (CDS) for removing a specific fixed patterned noise of a selected pixel 104 and an analog to digital (A/D) conversion of the signal.

The horizontal drive circuit 124 can include a shift register. The horizontal drive circuit 124 can select each column signal processing circuit 120 in order by sequentially outputting horizontal scanning pulses, causing each column signal processing circuit 120 to output a pixel signal to a horizontal signal line 144.

The output circuit 128 can perform predetermined signal processing with respect to the signals sequentially supplied from each column signal processing circuit 120 through the horizontal signal line 144. For example, the output circuit 128 can perform a buffering, black level adjustment, column variation correction, various digital signal processing, and other signal processing procedures. An input and output terminal 148 exchanges signals between the image sensor 100 and external components or systems.

Accordingly, at least portions of a color sensing image sensor 100 in accordance with at least some embodiments of the present disclosure can be configured as a CMOS image sensor of a column A/D type in which column signal processing is performed.

Figure 2A:
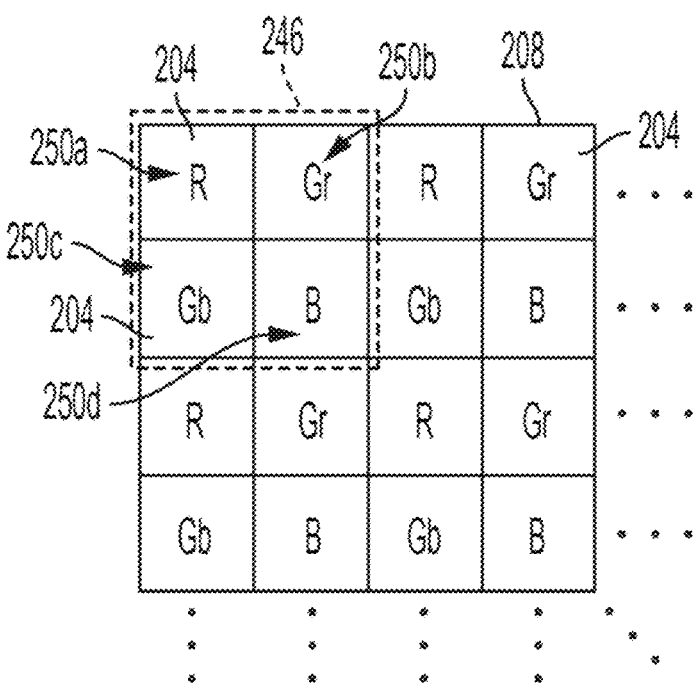
FIG. 2A is a plan view of a portion of an exemplary color sensing image sensor in accordance with the prior art.
Figure 2B:
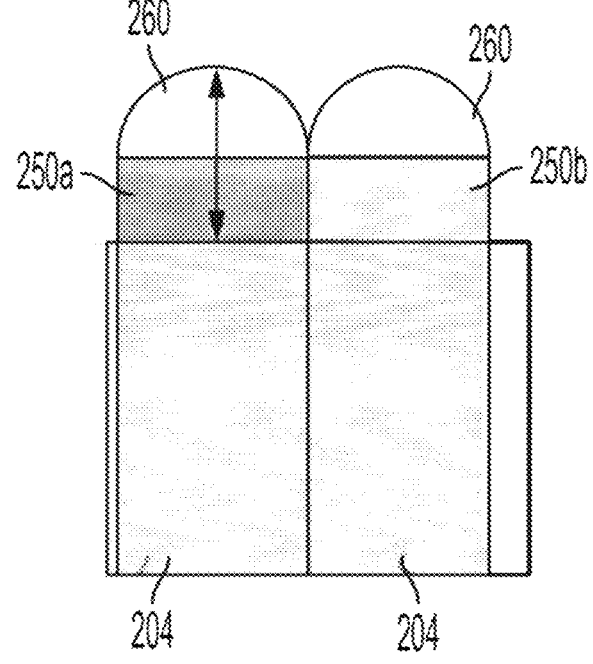
FIG. 2B is a cross section of a portion of an exemplary color sensing image sensor in accordance with the prior art.
Figure 3:
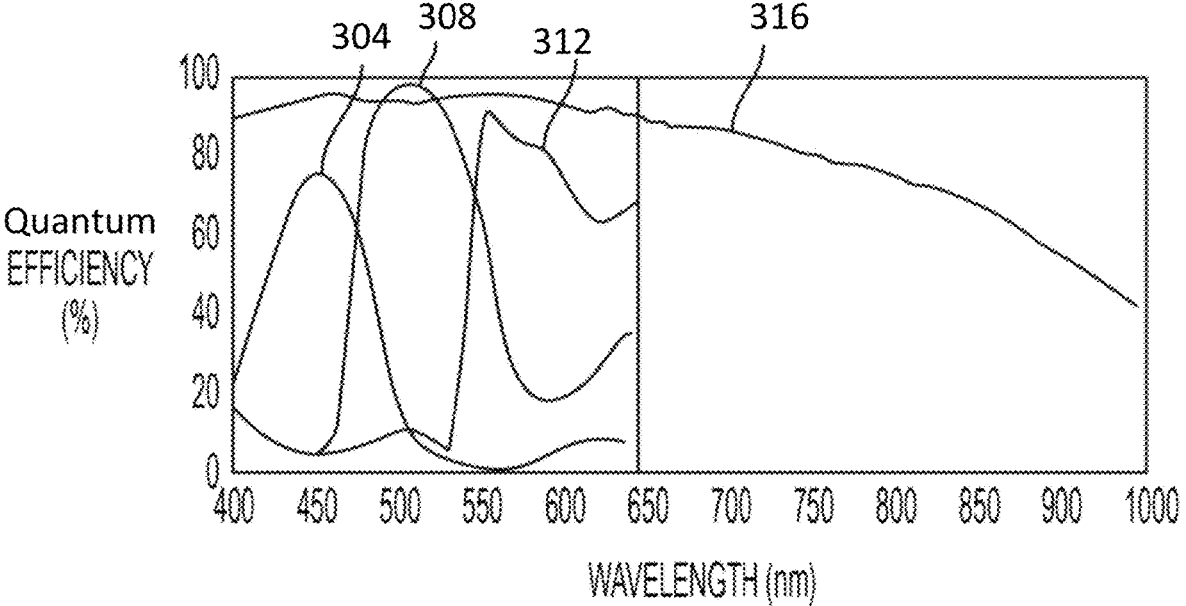
FIG. 3 is a graph depicting the sensitivity to light of different wavelengths of an exemplary image sensor in accordance with the prior art.

With reference now to FIGS. 2A and 2B, portions of a pixel array 208 of an exemplary color sensing image sensor in accordance with the prior art are depicted. FIG. 2A shows a portion of the pixel array 208 in a plan view, and illustrates how individual pixels 204 are disposed in 2×2 sets 246 of four pixels 204. In this particular example, each 2×2 set 246 of four pixels 204 is configured as a so-called Bayer array, in which a first one of the pixels 204 is associated with a red color filter 250a, a second one of the pixels 204 is associated with a green color filter 250b, a third one of the pixels 204 is associated with another green color filter 250c, and fourth one of the pixels 204 is associated with a blue color filter 250d. FIG. 2B illustrates a portion of the pixel 204 encompassing one such Bayer array in cross section, and additionally depicts micro lenses 260 that function to focus light onto an associated pixel 204. In such a configuration, each individual pixel 204 is only sensitive to a portion of the visible spectrum. As a result, the spatial resolution of the image sensor is reduced as compared to monochrome sensors. Moreover, because the light incident on the photosensitive portion of each pixel 204 is filtered, sensitivity is lost. This is illustrated in FIG. 3, which includes lines 304, 308, and 312, corresponding to the sensitivity of pixels associated with blue, green and red filters 250 respectively, and also with an infrared-cut filter. For comparison, the sensitivity of a monochrome sensor that is not associated with any filters is shown at line 316.

Figure 4A:
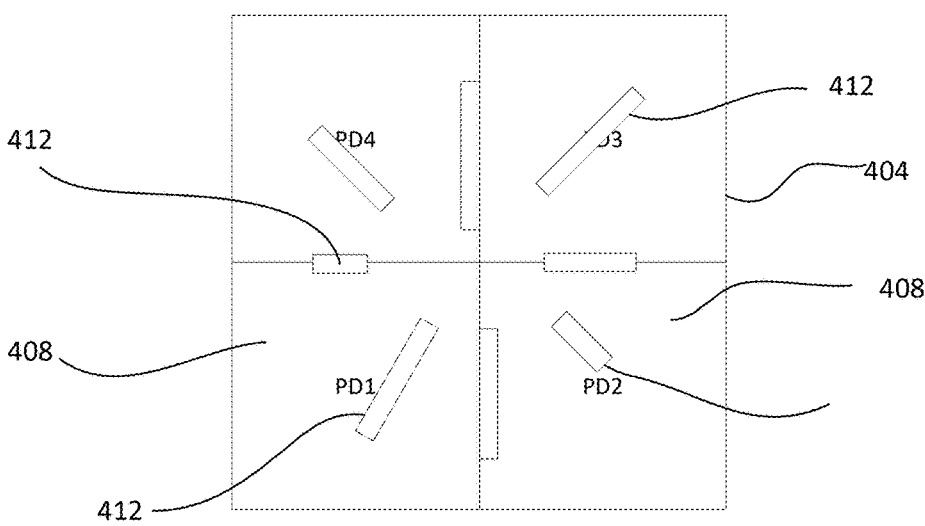
FIG. 4A is a plan view of a pixel included in an exemplary color sensing image sensor incorporating diffractive elements in accordance with the prior art.
Figure 4B:
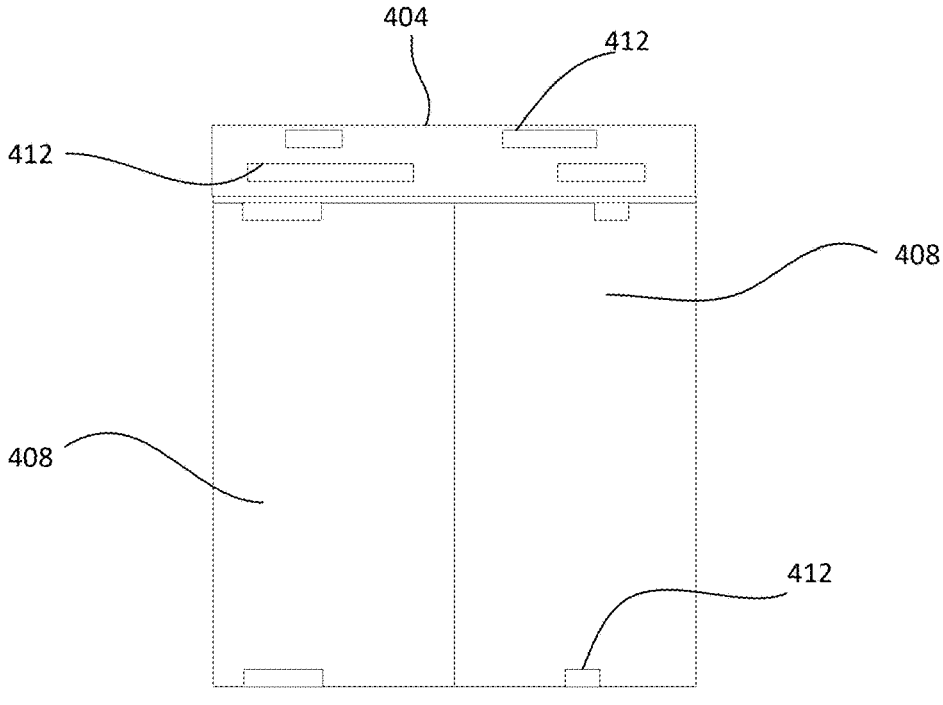
FIG. 4B is a cross section of a pixel included in an exemplary color sensing image sensor incorporating diffractive elements in accordance with the prior art.

FIG. 4A is a plan view and FIG. 4B is a cross section of a pixel 404 of an exemplary color sensing image sensor incorporating diffractive elements in accordance with the prior art. The pixel 404 includes a plurality of sub-pixels 408 and associated diffraction elements or features 412. The sub-pixels 408 within a pixel 404 generally include adjacent photoelectric conversion elements or areas. In operation, each subpixel 408 generates a signal in proportion to an amount of light incident thereon. The diffraction features 412 are generally centered in or about the light incident surface of the pixel 404. The diffraction features 412 can differ in size and shape from one another. In addition, the diffraction features 412 can be disposed in one or more layers of the pixel 404, as shown in FIG. 4B. The diffraction features 412 generally have a higher index of refraction than the surrounding material of the pixel 404. The diffraction features 412 generate different diffraction patterns across the sub-pixels 408 in response to receiving light of different wavelengths. These different patterns can be detected as different ratios of signals produced by the sub-pixels 408. Moreover, as the different patterns are produced by different wavelengths, they can be correlated to different colors of incident light. Accordingly, the pixel 404 can detect a color of incident light without the use of color filters. However, the accuracy and resolution with which such a pixel 404 can determine the color of incident light is prone to errors, particularly in the presence of noise.

Figure 5:
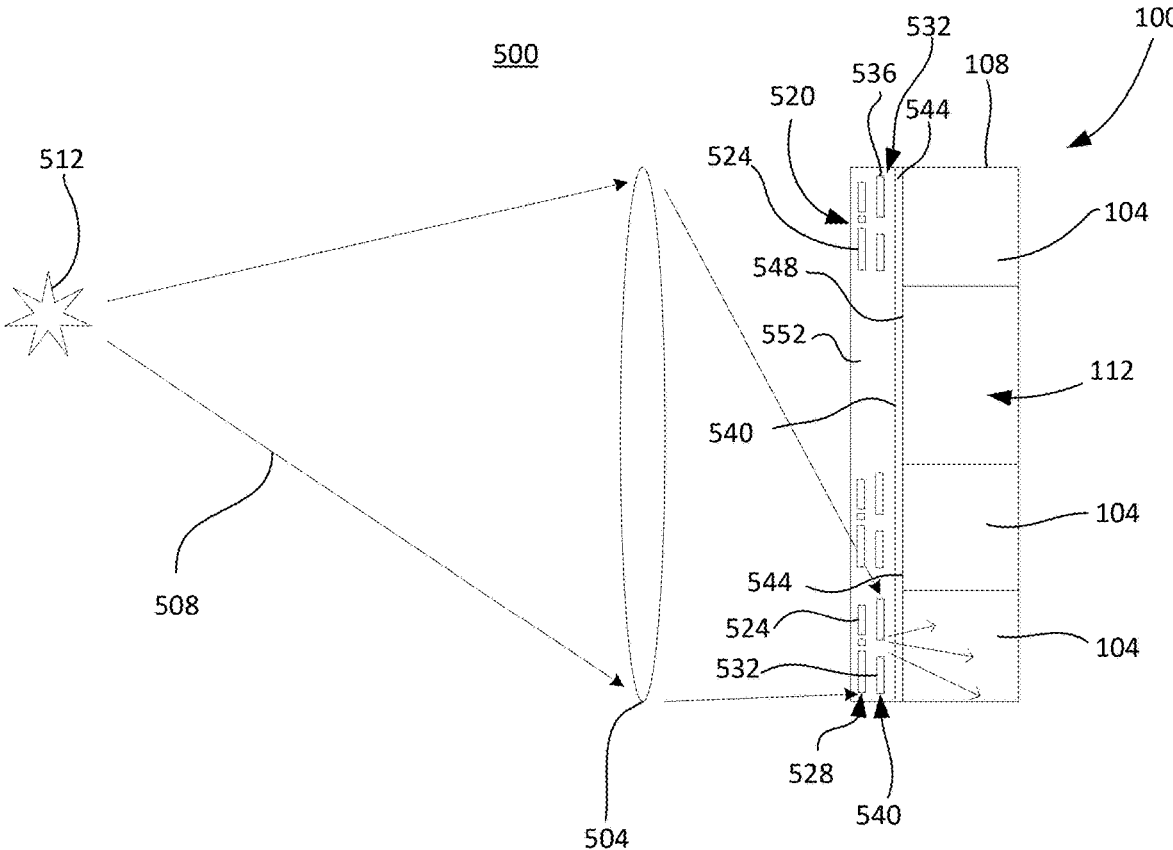
FIG. 5 depicts components of a system incorporating a color sensing image sensor in accordance with embodiments of the present disclosure.

FIG. 5 depicts components of a system 500 incorporating a color sensing image sensor 100 in accordance with embodiments of the present disclosure, including a cross section view of elements of the pixel array 108 of the color sensing image sensor 100. As shown, the system 500 can include an optical system 504 that collects and focuses light from within a field of view of the system 500, including light 508 reflected or otherwise received from an object 512 within the field of view of the system 500, onto pixels 104 included in the pixel array 108 of the image sensor 100. As can be appreciated by one of skill in the art after consideration of the present disclosure, the optical system 504 can include a number of lenses, mirrors, apertures, shutters, filters or other elements. In accordance with embodiments of the present disclosure, the pixel array 108 includes an imaging or sensor substrate 112 in which the pixels 104 of the array 108 are formed. In addition, a plurality of sets of diffraction features or elements 520 are included, with one set of diffraction features 520 provided for each pixel 104 within the array 108. Diffraction elements 524 within each set of diffraction features 520 can be disposed in a diffraction element layer 528 included in an element substrate 522. Embodiments of the present disclosure also include a plurality of sets of color filters 532 provided for each pixel 104 within the array 108. Color filters 536 within each set of color filters 532 can be disposed in a color filter layer 540 included in the element substrate 522. In addition, an anti-reflective coating 544 can be disposed between the light incident surface 548 of the sensor substrate 112 and an element substrate 552.

Figure 6A:
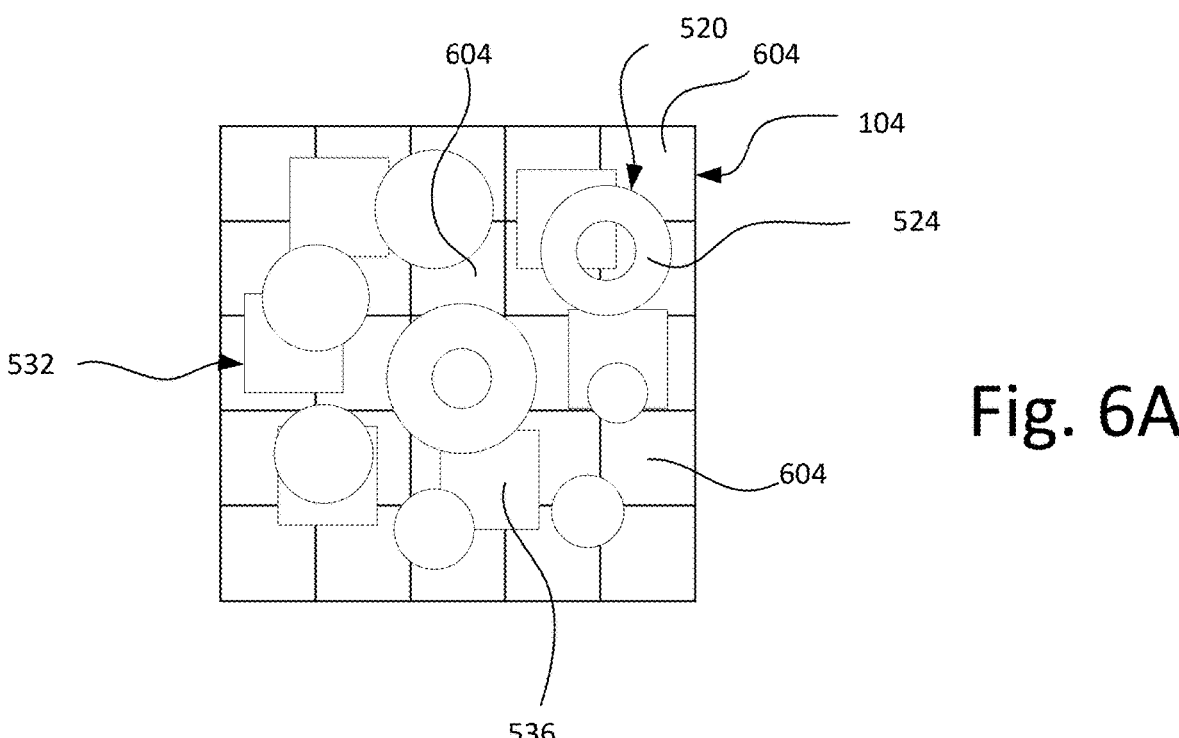
FIG. 6A is a plan view of a pixel included in a color sensing image sensor in accordance with embodiments of the present disclosure.
Figure 7A:
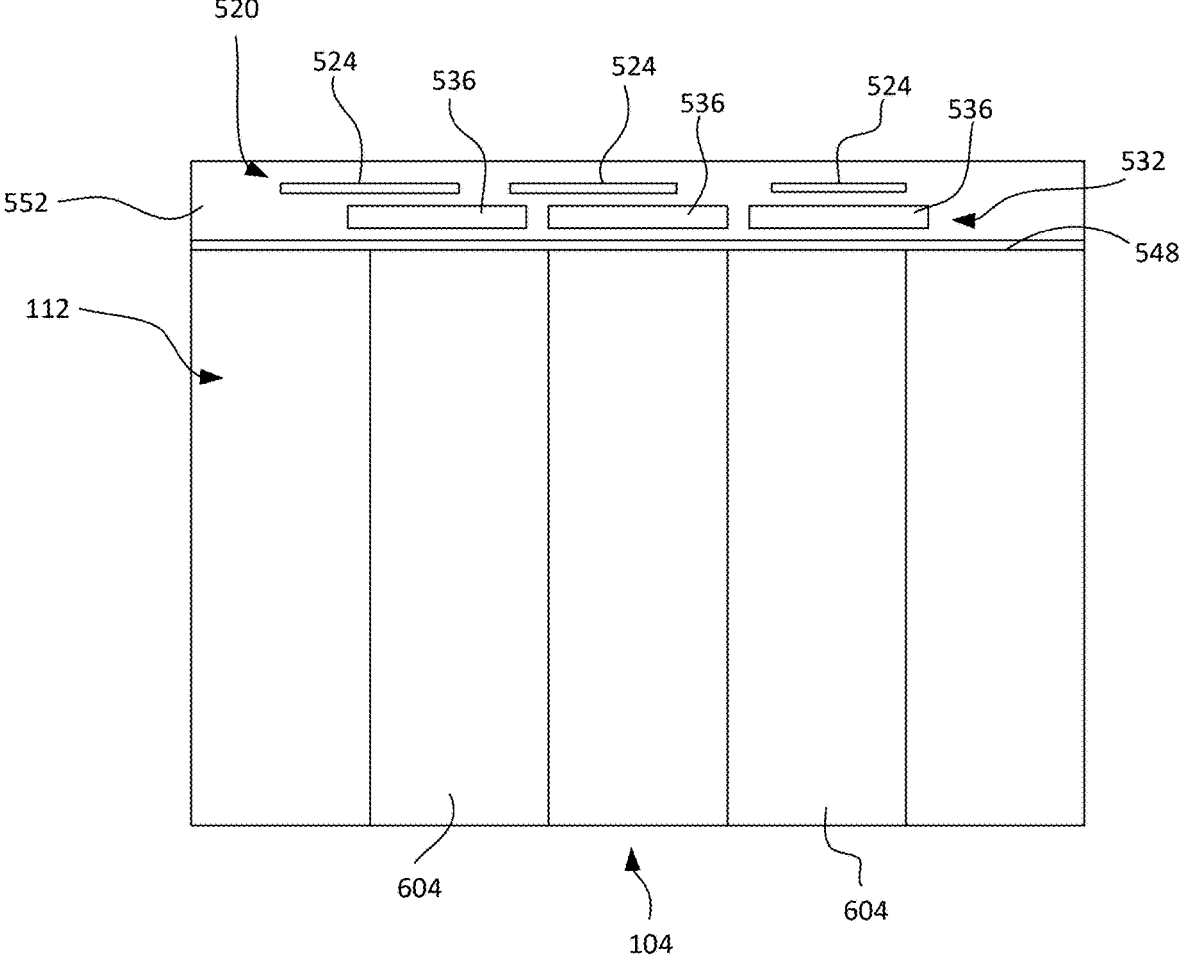
FIG. 7A is a cross-section in elevation of a pixel included in a color sensing image sensor in accordance with embodiments of the present disclosure.

FIG. 6A is a plan view of a light incident surface side of a pixel 104 included in a color sensing image sensor 100 in accordance with embodiments of the present disclosure, and FIG. 7A is a cross-section in elevation of the pixel 104 of FIG. 6A. As shown, each pixel 104 within the array 108 includes a plurality of sub-pixels 604. The sub-pixels 604 within a pixel 104 can be formed as adjacent photoelectric conversion elements or areas within the image sensor substrate 112. In operation, each sub-pixel 604 generates a signal in proportion to an amount of light incident thereon. As an example, each sub-pixel 604 is a separate photodiode. As represented in FIG. 6A, each pixel 104 can include twenty-five sub-pixels 604, with each of the sub-pixels 604 having an equally sized, square-shaped light incident surface. However, embodiments of the present disclosure are not limited to such a configuration, and can instead have any number of sub-pixels 604, with each of the sub-pixels 604 having the same or different shape, and/or the same or different size, as other sub-pixels 604 within the pixel 104.

In the example of FIGS. 6A and 7A, the color filters 536 are included in a color filter layer 540 that is disposed between the diffraction element layer 528 that includes the diffraction elements 524 and the light incident surface 548 of the sensor substrate 112 (i.e. the diffraction element layer 528 and the color filter layer 540 are configured in the order illustrated in FIG. 5).

Figure 6B:
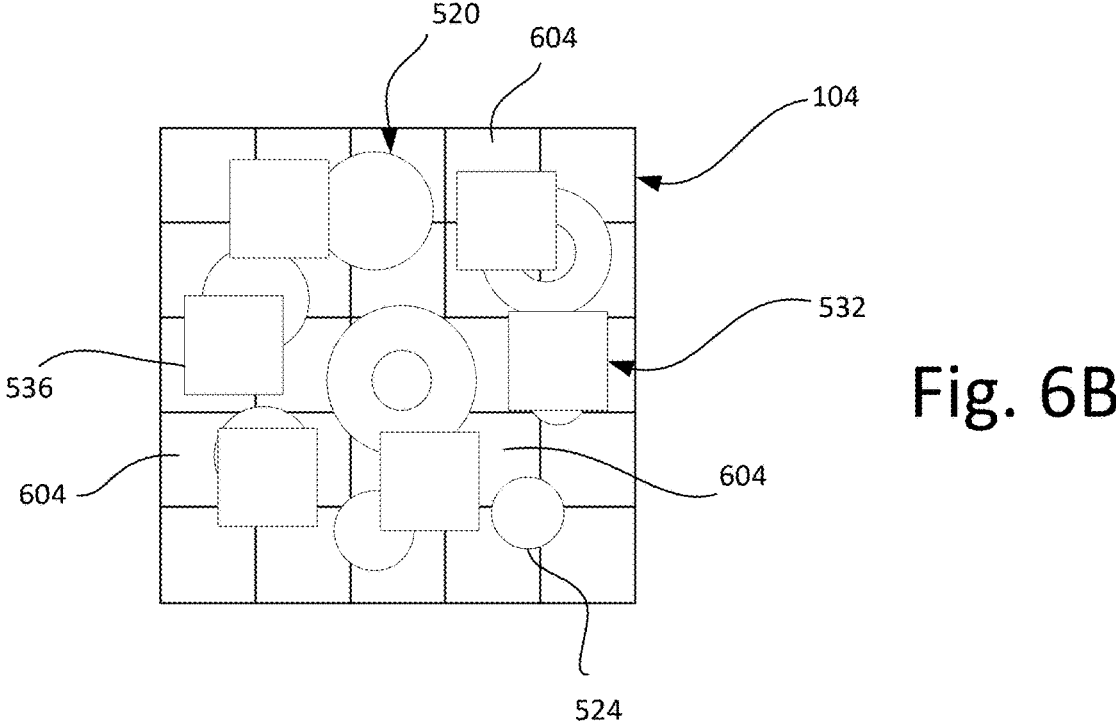
FIG. 6B is a plan view of a pixel included in a color sensing image sensor in accordance with other embodiments of the present disclosure.
Figure 7B:
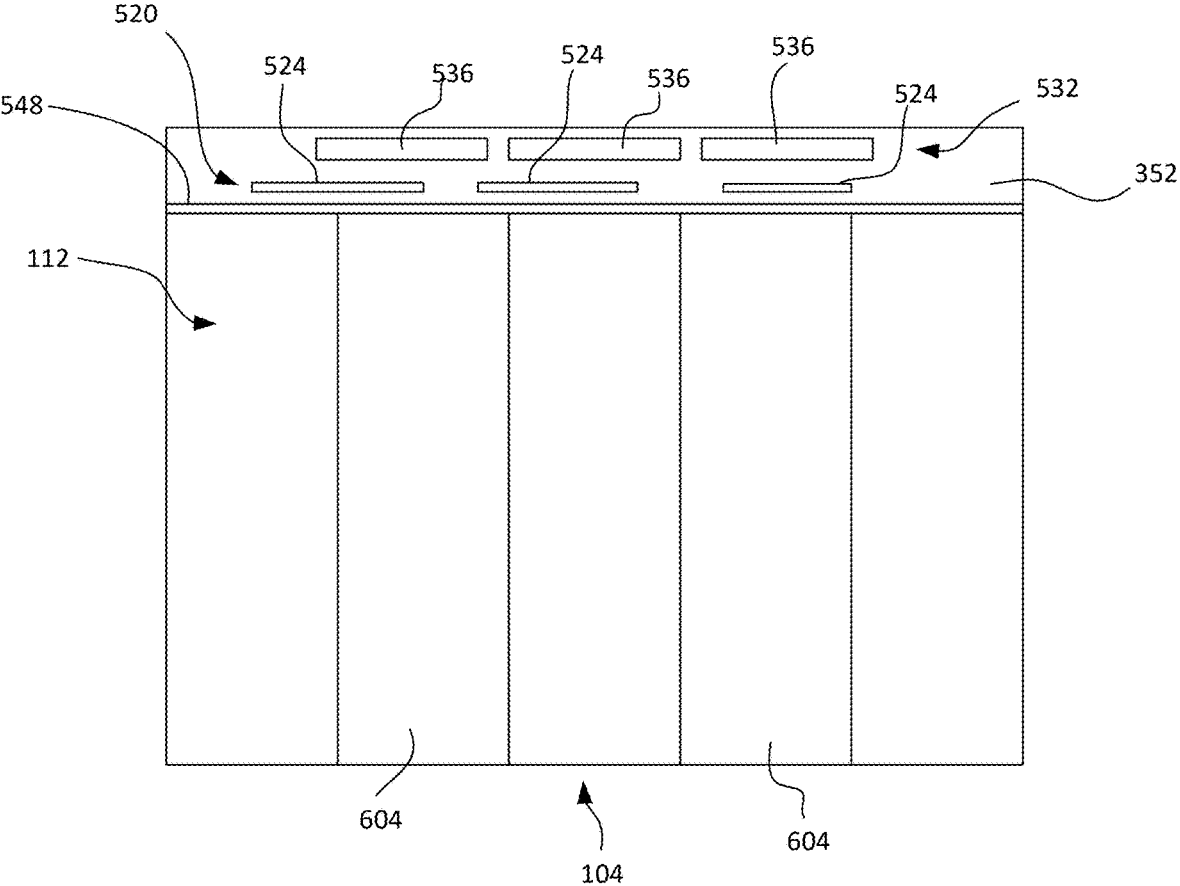
FIG. 7B is a cross-section in elevation of a pixel included in a color sensing image sensor in accordance with other embodiments of the present disclosure.

FIG. 6B is a plan view of a light incident surface side of a pixel 104 included in a color sensing image sensor 100 in accordance with other embodiments of the present disclosure, and FIG. 7B is a cross-section in elevation of the pixel 104 of FIG. 6B. The configuration of the pixel 104 illustrated in FIGS. 6B and 7B is the generally the same as the pixel illustrated in FIGS. 6A and 7A, except that in FIGS. 6B and 7B the diffraction element layer 528 in which the diffraction elements 524 are disposed is between the color filter layer 540 in which the color filters 536 are disposed and the light incident surface 548 of the sensor substrate 112.

Figure 6C:
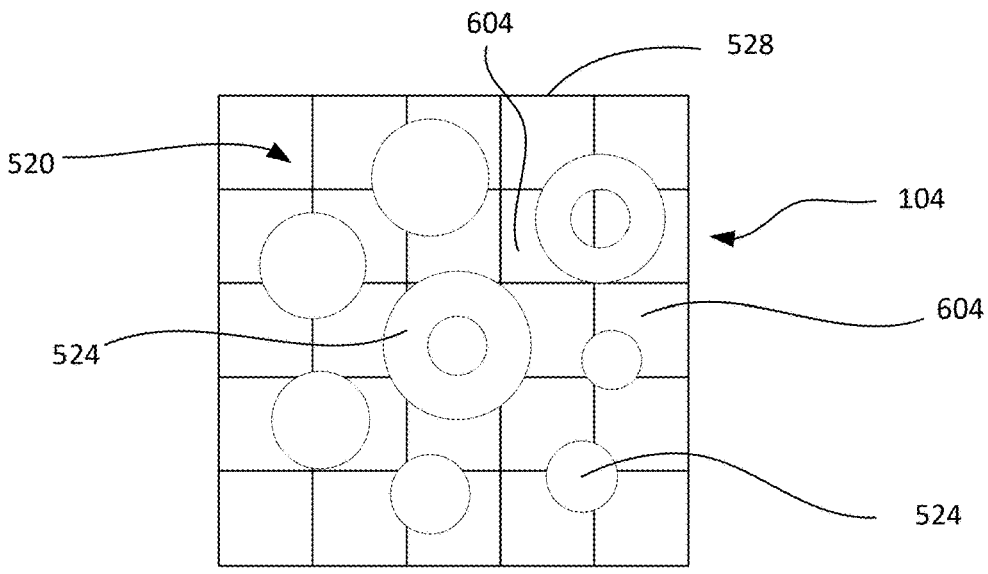
FIG. 6C is a plan view of a diffractive element layer of a pixel included in a color sensing image sensor in accordance with embodiments of the present disclosure.

FIG. 6C is a plan view of the diffraction elements 524 of the diffraction element layer 528 in relation to the sub-pixels 604 of a pixel 104 in accordance with embodiments of the present disclosure. As shown, an area of the diffraction elements 524 occupies or covers less than all of an area of the light incident surface 548 of the pixel 104. In addition, no one diffraction element 524 has an area that entirely overlays or covers any one of the sub-pixels 604 of the pixel 104. In accordance with further embodiments of the present disclosure, each diffraction element 524 can at least partially overlap more than one sub-pixel 604 within the pixel 104. In this example, each of the diffraction elements 524 can, in a plan view, have a round overall form. In addition, at least some of the diffraction elements 524, such as diffraction element 524a, can have a cylindrical form, with an open center. In addition, at least some of the diffraction elements 524, such as diffraction element 524b, can be configured as solid discs or cylinders. In other embodiments of the present disclosure, the diffraction elements 524 can be formed as linear elements, or a combination of linear and round elements. In accordance with embodiments of the present disclosure, each diffraction element 524 is formed of a transparent material having an index of refraction that is higher than an index of refraction of the surrounding element substrate 522.

Figure 6D:
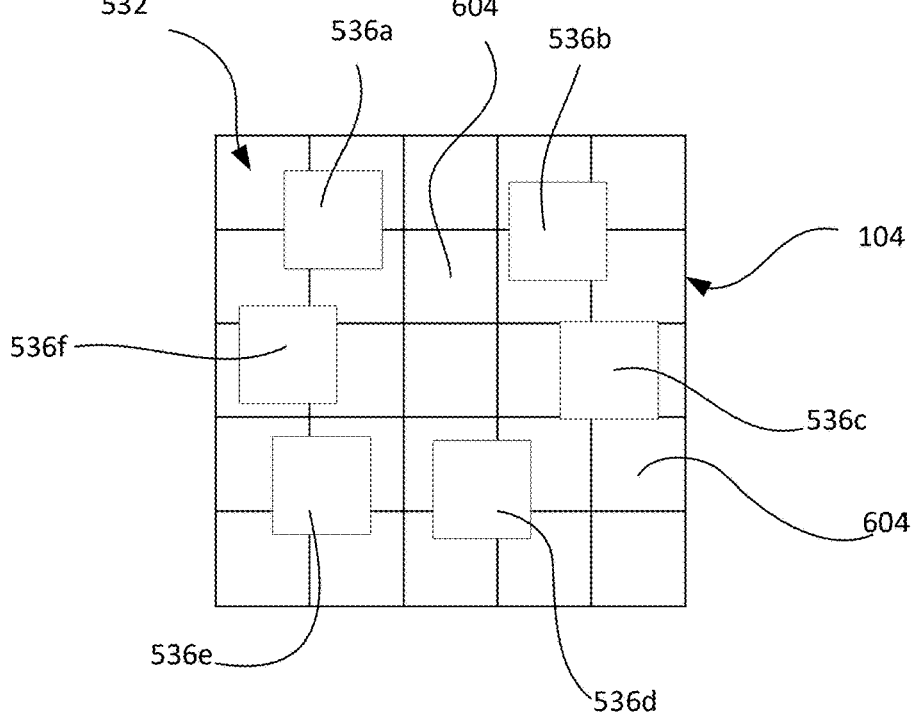
FIG. 6D is a plan view of a color filter layer of a pixel included in a color sensing image sensor in accordance with embodiments of the present disclosure.

FIG. 6D is a plan view of a color filter layer 540 in relation to the sub-pixels 604 of a pixel 104 in accordance with embodiments of the present disclosure. The area of the color filters 536 occupies or covers less than all of a light sensitive area of the pixel 104. In addition, the color filters 536 are disposed within the color filter layer 540 such that no one color filter 536 is aligned directly over any one of the sub-pixels 604. In addition, no one color filter 536 has an area that entirely overlays or covers any one of the sub-pixels 604. Moreover, different color filters 536 within the same set of color filters 532 can have different overlapping relationships with different sets of sub-pixels 604. Accordingly, the color filters 536 have a nonspecific geometry relative to the sub-pixels 604 of the pixel 104. In accordance with the least some embodiments of the present disclosure, and as depicted in FIG. 6D, each of the color filters 536 can be of a different color or wavelength band. For instance, a first one of the color filters 536a can be a red color filter, a second one of the color filters 536b can be a green color filter, a third one of the color filters 536c can be a blue color filter, a fourth one of the color filters 536d can be a cyan color filter, a fifth one of the color filters 536e can be a magenta color filter, and a sixth one of the color filters 536f can be a yellow color filter. In accordance with further embodiments of the present disclosure, color filters 536 can include one or more color filters of a selected wavelength band that does not necessarily coincide to a standard color. In addition, the number of color filters 536 within a color filter layer 540 is not limited to any particular number. Instead, the number of different color filters 536 associated with a given pixel 104 can be selected based on considerations of wavelength selectivity. In general, the greater the number of color filters 536 of different wavelengths associated with a pixel 104, the greater the wavelength selectivity. Moreover, color filters 536 having the same color or wavelength band can be included in a set of color filters 532 disposed over different portions of a light incident surface of the same pixel 104.

In the example shown in FIG. 6D, each of the color filters 536 has an area that is the same or about the same as an area of the sub-pixels 604. No one color filter 536 is disposed so as to entirely cover one sub-pixel 604. In addition, the total light sensitive area of the pixel 104, as represented by the summed areas of the sub-pixels 604, overlaid by a color filter 536 is about 24% in this example. However, other arrangements are possible. For instance, the proportion of the light sensitive area of a pixel 604 overlaid by a color filter 536 can be greater than 24% where greater color accuracy is desired. As another example, the proportion of the total light sensitive area of the pixel 104 overlaid by a color filter 536 can be less than 24% where greater sensitivity is desired.

In this example, each of the color filters 536 has a square overall form, and each of the color filters 536 has the same area. However, other shapes are possible. In addition, different color filters 536 within a set of color filters 532 can have different areas. Moreover, both the shape and areas of color filters 536 within a set of color filters 532 can differ from at least some of the other color filters within the same set 532. As examples, color filters can have a round, rectangular, triangular, other geometric shapes, or irregular shapes. In addition, variables such as the proportion of the overall photosensitive surface of the pixel 104 overlaid by color filters 536 can be selected based on considerations such as manufacturing simplicity or improved sensitivity of the underlying sub-pixels 604.

In accordance with embodiments of the present disclosure, the color filters 536 can themselves contribute to the diffraction of incident light, and can therefore act like a diffraction element 524. However, the magnitude of the diffraction of incident light by a color filter 536 is generally not as strong as that of a diffraction element 524. The diffraction effect can be increased by framing the color filters 536 within thin metal walls. In addition, in accordance with embodiments of the present disclosure, and index of refraction of the color filters 536 is higher than an index of refraction of the substrate 552 surrounding the color filters 536.

Figure 8:
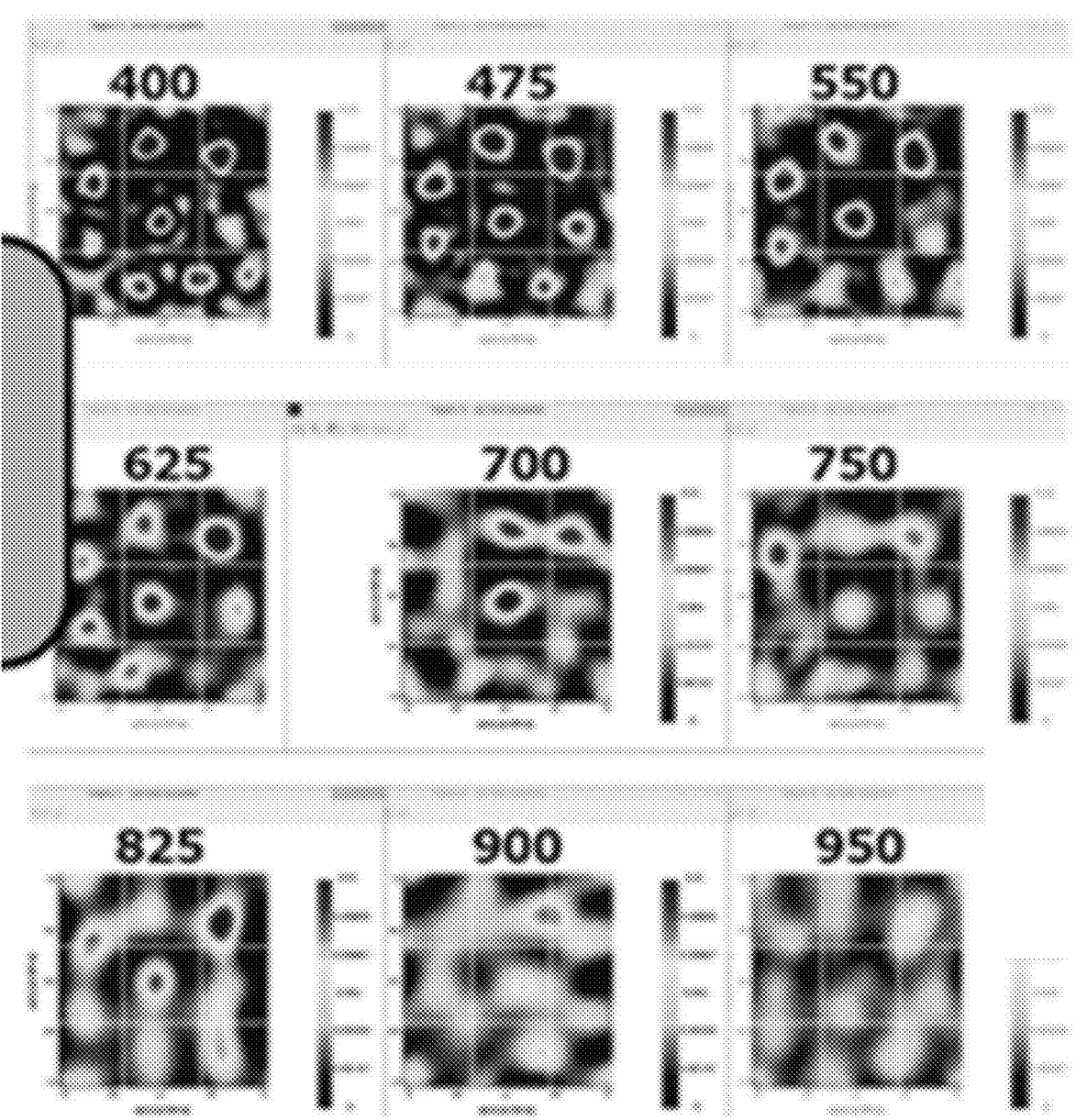
FIG. 8 depicts the diffraction of light of different wavelengths by a set of diffractive elements across the sub-pixels of a pixel included in a color sensing image sensor in accordance with embodiments of the present disclosure.

FIG. 8 depicts the diffraction of light of different wavelengths across the sub-pixels 604 of a pixel 104 included in a color sensing image sensor 100 in accordance with embodiments of the present disclosure. In this example, diffraction patterns such as may be created primarily by the diffraction elements 524 and at least partially by the color filters 536 disposed adjacent the light incident surface of the sub-pixels 604 in response to light at nine sample wavelengths (i.e. at 400 nm, 475 nm, 550 nm, 625 nm, 700 nm, 750 nm, 825 nm, 900 nm, and 950 nm) is illustrated.

In accordance with embodiments of the present disclosure, the different distributions of different colored light across the different sub-pixels 604 of a pixel 104, in combination with the filtering effect on the light by the included color filters 536 allows the color of the light incident of the pixel 104 to be determined. In particular, the differences in the amount of light incident on the different sub-pixels 604 caused by the diffraction and filtering of that light in turn results in the generation of different signal amounts by those sub-pixels 604. In particular, the different distributions 904 of light across the sub-pixels for the light of different wavelengths results in different signal amplitudes from the different sub-pixels 604. These differences can be expressed as a number of different sub-pixel 604 pair signal ratios. As can be appreciated by one of skill in the art after consideration of the present disclosure, taking the ratios of the signals from each unique pair of sub-pixels 604 within a pixel 104 allows the distribution pattern 904 to be characterized consistently, even when the intensity of the incident light varies. Moreover, this simplifies the determination of the color associated with the detected distribution pattern by producing normalized values. Thus, a set of signal ratios for a particular wavelength of light applies for any intensity of incident light.

Figure 9:
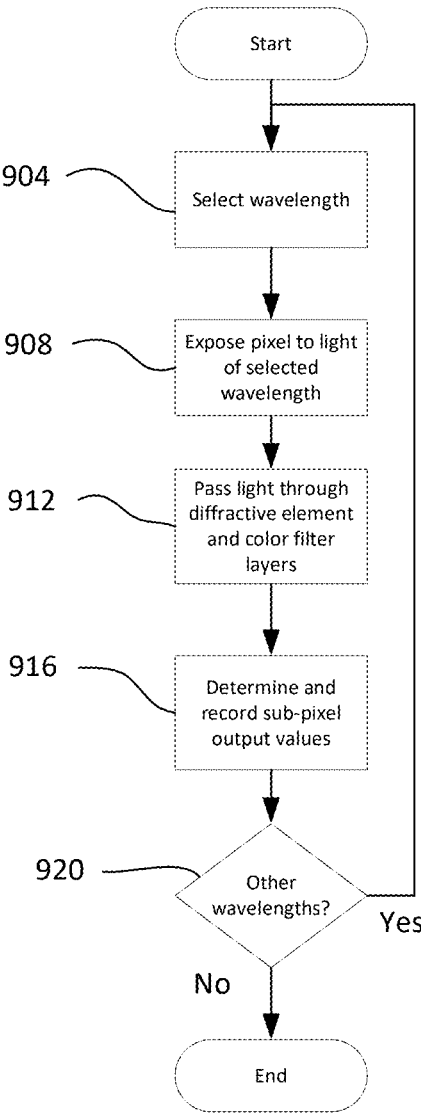
FIG. 9 depicts aspects of a method for calibrating the pixels of an image sensor in accordance with embodiments of the present disclosure.

With reference now to FIG. 9, aspects of a method for calibrating the pixels 104 of an image sensor 100 having sets of diffraction features 520 and color filters 536 in accordance with embodiments of the present disclosure, to enable the color of light incident on the different pixels 104 to be determined, are presented. More particularly, in a pixel 104 having a twenty-five sub-pixels 604, twenty-five different sub pixel 604 signals are available which, in an ideal case (i.e. without any signal noises) enables an incident light spectrum with twenty-five wavelength points to be recovered. The recovery of the wavelength points can be performed by solving a system of twenty-five linear equations using an inverse calibration matrix, where the calibration matrix is the 25×25 element matrix constructed from the measured sub-pixel 604 quantum efficiencies for each of 25 different wavelengths. The inclusion of color filters 536 placed over or under the diffraction elements 524 as described herein reduces the noise present in the signals produced by the sub-pixels 604 when measuring light of an unknown wavelength.

Initially, the calibration process includes selecting a wavelength or color for calibration (step 904). Where a pixel 104 has a relatively large number of sub-pixels 604 (e.g. 25 sub-pixels 604), the "color" is more conveniently expressed as a wavelength. The pixel 104 is then exposed to light of the selected wavelength (step 908). The incident light is passed through the diffractive element 528 and color filter 540 layers and passed to the sub-pixels 604 of the pixel 104 (step 912). In accordance with embodiments of the present disclosure, the light is scattered by the diffraction elements 524 and some of the light is filtered by the color filters 536 adjacent the light incident surface of the sub-pixels 604. In addition, the color filters 536 provided in accordance with embodiments of the present disclosure and disposed adjacent the light incident surface of the sub-pixels 604 can contribute to the diffraction of the incident light. The strength of the signals produced at each of the sub-pixels 604 is then determined and recorded (step 916). Recording the obtained sub-pixel 604 output values can include placing them in a table.

At step 920, a determination is made as to whether different wavelengths remain to be calibrated. If additional wavelengths remain to be calibrated, the process returns to step 904, where a next wavelength is selected. In accordance with embodiments of the present disclosure, each of the different wavelengths used for calibration may be spaced apart from a next closest wavelength by an equal amount. In accordance with other embodiments of the present disclosure, the different wavelengths used for calibration may be located at different intervals. In accordance with still other embodiments of the present disclosure, the different wavelengths used for calibration may coincide with wavelengths that are of particular interest. After a determination is made at step 920 that subpixel 604 signal strength ratios for all of the desired wavelengths have been obtained, the process of calibration can end. As can be appreciated by one of skill in the art after consideration of the present disclosure, the calibration process can be performed for all of the pixels 104 within the image sensor 100 array 108, sequentially or simultaneously. Alternatively, the calibration process can be performed for a single, representative pixel 104. Accordance with still other embodiments, the calibration process can be performed for a single, representative pixel 104 in each of a plurality of areas or regions of the array 108.

Figure 10:
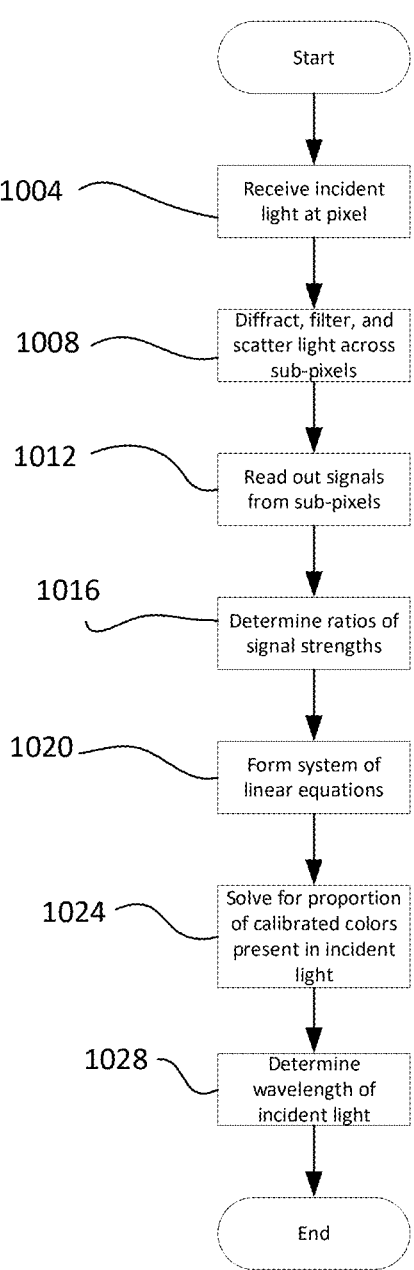
FIG. 10 depicts aspects of a method for determining a wavelength of light incident on the pixels of an image sensor in accordance with embodiments of the present disclosure.

With reference now to FIG. 10, aspects of a method for determining a color of light incident on an image sensor 100 pixel 104 configured and calibrated in accordance with embodiments of the present disclosure are presented. Initially, at step 1004, incident light of an unknown wavelength is received at a pixel 104 configured in accordance with embodiments of the present disclosure, and in particular having a set of diffraction features 520 and color filters 536 as disclosed herein. The incident light is scattered and diffracted by the diffraction elements 526, and some of the incident light is filtered by the color filters 536, producing a light intensity spot distribution across the sub-pixels 604 of the pixel 104 as a function of the wavelength of the incident light (1008).

The signals generated by the sub-pixels 604 in response to receiving the incident light are read out (step 1012), and the ratios of signal strengths between pairs of the sub-pixels 604 within the pixel 104 are determined (1016). The color content of the incident light can then be determined by forming a system of linear equations, with each equation within the system corresponding to a different pair of sub-pixels (step 1020). For example, the system includes 25 equations where the sensor is calibrated for 25 wavelengths. As can be appreciated by one of skill in the art after consideration of the present disclosure, ratios for the same combinations of sub-pixels 604 as were used for calibrating the subject pixel 104 are represented in the equations. The system of equations can then be solved for the unknowns, yielding the proportions or relative contributions of the calibrated colors to the light received at the subject pixel (step 1024). The determined proportions can in turn be used to determine the wavelength of the light incident on the pixel 104 (step 1028). The intensity of the light at the pixel 104 is given by the sum of the signals from the included sub-pixels 604. The process can be repeated for each pixel 104 in the array 108.

Figure 11A:
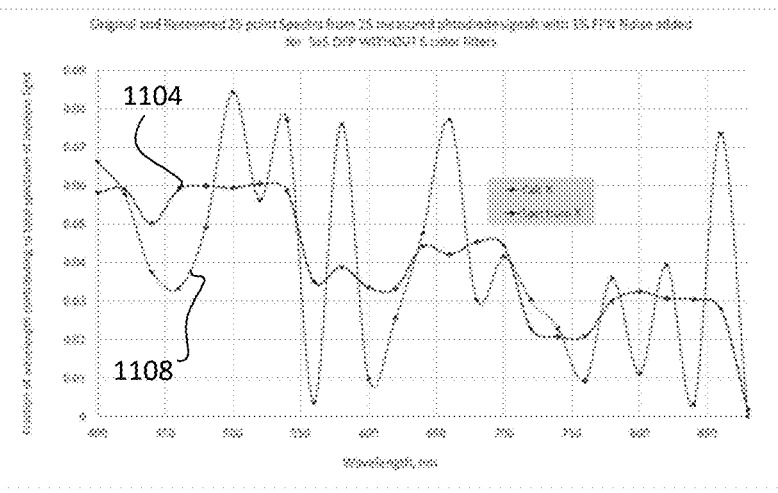
FIG. 11A depicts original and recovered spectra for a diffractive focusing pixel in accordance with the prior art

FIG. 11A depicts original and recovered spectra for a diffractive focusing pixel in accordance with the prior art. A comparison of the spectrum of the incident light 1104 with the recovered spectrum 1108 and the presence of noise for the prior art color sensing image sensor incorporating diffractive elements illustrates a wide divergence between the two.

Figure 11B:
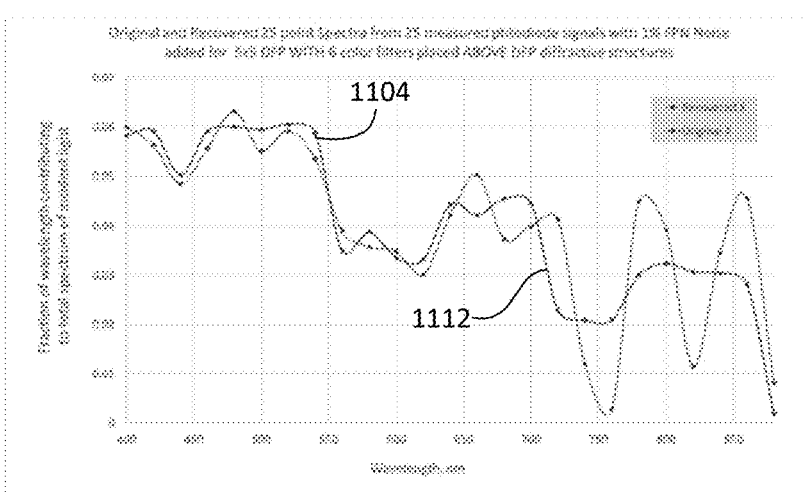
FIG. 11B depicts original and recovered spectra for a pixel in accordance with embodiments of the present disclosure.

FIG. 11B depicts original and recovered spectra for a pixel in accordance with embodiments of the present disclosure. In this example, the recovered spectrum 1112 closely tracks the spectrum of the incident light 1104 over a relatively wide range of wavelengths (e.g. over a range from about 400 nm to about 640 nm). As the pixel 104 in this example includes twenty-five sub-pixels 604 the spectrum of the incident light 1104 is represented across twenty-five calibration points, and the recovered spectrum is represented across twenty-five measurement points. In this example, the image sensor 100 pixel 104 generating the recovered spectrum 1112 features diffraction elements 524 that are disposed between the color filters 536 and the light incident surfaces of the sub-pixels 604.

Figure 11C:
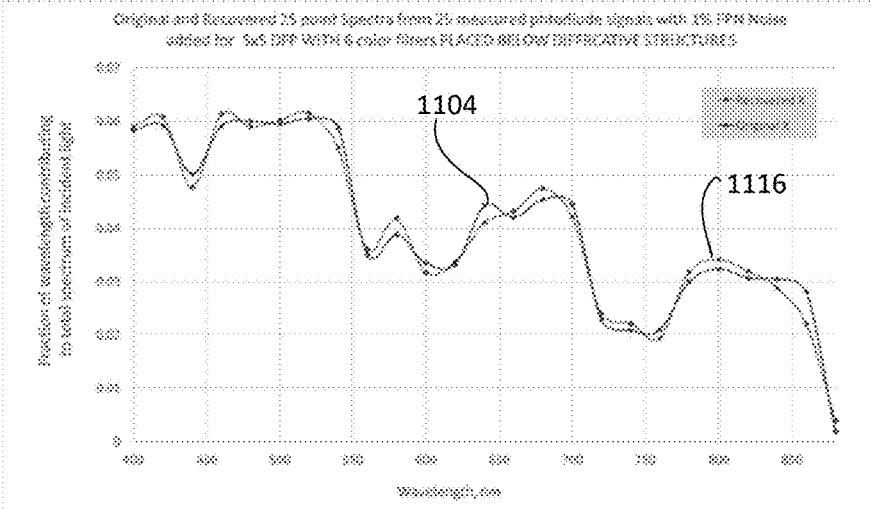
FIG. 11C depicts original and recovered spectra for a pixel in accordance with other embodiments of the present disclosure.

FIG. 11C depicts original and recovered spectra for a pixel in accordance with other embodiments of the present disclosure. In this example, the recovered spectrum 1116 closely tracks the spectrum of the incident light 1104 across all of the measured wavelength range (e.g. over a range from about 400 nm to about 900 nm). As the pixel 104 in this example includes twenty-five sub-pixels 604 the spectrum of the incident light 1104 is represented across twenty-five calibration points, and the recovered spectrum is represented across twenty-five measurement points. In this example, the image sensor 100 pixel 104 generating the recovered spectrum 1116 features color filters 536 that are disposed between the diffraction elements 524 and the light incident surfaces of the sub-pixels 604. A comparison of the recovered spectra 1112 and 1116 in FIGS. 11B and 11C respectively illustrates that an embodiment of the present disclosure in which the color filters 536 are disposed between the diffraction elements 524 and the light incident surfaces of the sub-pixels 604 can offer improved spectral recovery over a wider range of wavelengths than an embodiment in which the diffraction elements 524 are between the color filters 536 and the light incident surfaces of the sub-pixels 604.

Figure 12:
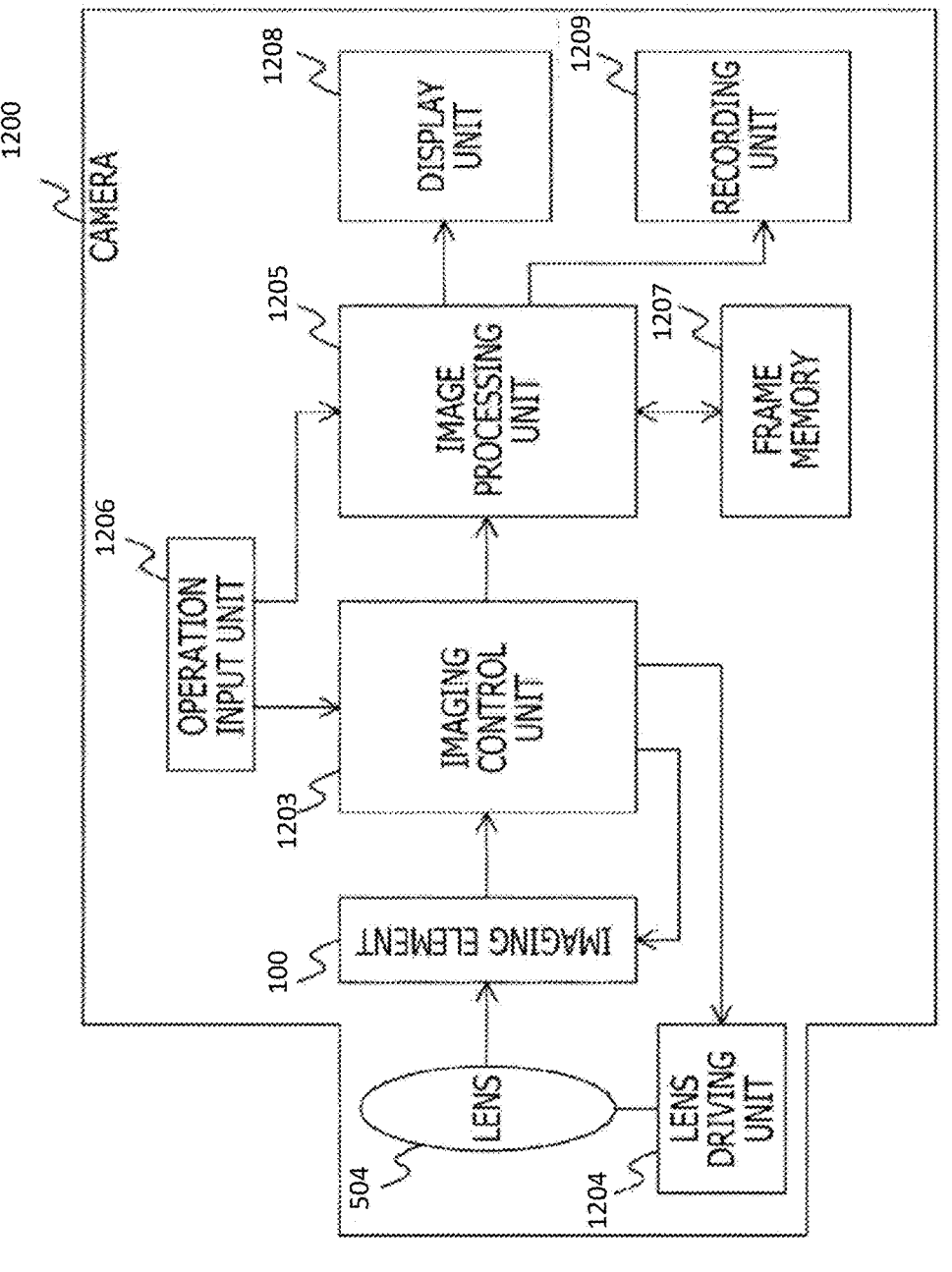
FIG. 12 is a block diagram illustrating a schematic configuration example of a camera that is an example of an image sensor in accordance with embodiments of the present disclosure.

FIG. 12 is a block diagram illustrating a schematic configuration example of a camera 1200 that is an example of an imaging apparatus to which a system 500, and in particular an image sensor 100, in accordance with embodiments of the present disclosure can be applied. As depicted in the figure, the camera 1200 includes an optical system or lens 504, an image sensor 100, an imaging control unit 1203, a lens driving unit 1404, an image processing unit 1205, an operation input unit 1206, a frame memory 1207, a display unit 1208, and a recording unit 1209.

The optical system 504 includes an objective lens of the camera 1200. The optical system 504 collects light from within a field of view of the camera 1200, which can encompass a scene containing an object. As can be appreciated by one of skill in the art after consideration of the present disclosure, the field of view is determined by various parameters, including a focal length of the lens, the size of the effective area of the image sensor 100, and the distance of the image sensor 100 from the lens. In addition to a lens, the optical system 504 can include other components, such as a variable aperture and a mechanical shutter. The optical system 504 directs the collected light to the image sensor 100 to form an image of the object on a light incident surface of the image sensor 100.

As discussed elsewhere herein, the image sensor 100 includes a plurality of pixels 104 disposed in an array 108. Moreover, the image sensor 100 can include a semiconductor element or substrate 112 in which the pixels 104 each include a number of sub-pixels 604 that are formed as photosensitive areas or photodiodes within the substrate 112. In addition, as also described elsewhere herein, each pixel 104 is associated with a set of diffraction features 520 and a set of color filters 536 positioned between the optical system 504 and the sub-pixels 604. The photosensitive sites or sub-pixels 604 generate analog signals that are proportional to an amount of light incident thereon. These analog signals can be converted into digital signals in a circuit, such as a column signal processing circuit 120, included as part of the image sensor 100, or in a separate circuit or processor. As discussed herein the distribution of light amongst the sub-pixels 604 of a pixel 104 is dependent on the light state of the incident light. The digital signals can then be output.

The imaging control unit 1203 controls imaging operations of the image sensor 100 by generating and outputting control signals to the image sensor 100. Further, the imaging control unit 1203 can perform autofocus in the camera 1200 on the basis of image signals output from the image sensor 100. Here, "autofocus" is a system that detects the focus position of the optical system 504 and automatically adjusts the focus position. For example, a method in which an image plane phase difference is detected by phase difference pixels arranged in the image sensor 100 to detect a focus position (image plane phase difference autofocus) can be used.

Further, a method in which a position at which the contrast of an image is highest is detected as a focus position (contrast autofocus) can also be applied. The imaging control unit 1203 adjusts the position of the lens 504 through the lens driving unit 1204 on the basis of the detected focus position, to thereby perform autofocus. Note that the imaging control unit 1203 can include, for example, a DSP (Digital Signal Processor) equipped with firmware.

The lens driving unit 1204 drives the optical system 504 on the basis of control of the imaging control unit 1203. The lens driving unit 1204 can drive the optical system 504 by changing the position of included lens elements using a built-in motor.

The image processing unit 1205 processes image signals generated by the image sensor 100. This processing includes, for example, assigning a light wavelength or color to light incident on a pixel 104 by determining ratios of signal strength between pairs of sub-pixels 604 included in the pixel 104, and determining an amplitude of the pixel 104 signal from the individual sub-pixel 604 signal intensities, as discussed elsewhere herein. In addition, this processing includes determining a wavelength of light incident on a pixel 104 by applying the observed ratios of signal strengths from pairs of sub-pixels 604 and calibrated ratios for those pairs stored in a calibration table or the like to solve a system of equations. The image processing unit 1205 can include, for example, a microcomputer equipped with firmware, and/or a processor that executes application programming, to implement processes for identifying color information in collected image information as described herein.

The operation input unit 1206 receives operation inputs from a user of the camera 1200. As the operation input unit 1206, for example, a push button or a touch panel can be used. An operation input received by the operation input unit 1206 is transmitted to the imaging control unit 1203 and the image processing unit 1205. After that, processing corresponding to the operation input, for example, the collection and processing of imaging an object or the like, is started.

The frame memory 1207 is a memory configured to store frames that are image signals for one screen or frame of image data. The frame memory 1207 is controlled by the image processing unit 1205 and holds frames in the course of image processing.

The display unit 1208 can display information processed by the image processing unit 1405. For example, a liquid crystal panel can be used as the display unit 1208.

The recording unit 1209 records image data processed by the image processing unit 1205. As the recording unit 1209, for example, a memory card or a hard disk can be used.

An example of a camera 1200 to which embodiments of the present disclosure can be applied has been described above. The image sensor 100 of the camera 1200 can be configured as described herein. Specifically, the image sensor 100 can diffract incident light across different light sensitive areas or sub-pixels 604 of a pixel 104, and can apply ratios of signals from pairs of the sub-pixels 604 to and corresponding stored ratios for a number of different colors, to identify relative contributions of constituent colors, and thus the color of the incident light.

Note that, although a camera has been described as an example of an electronic apparatus, an image sensor 100 and other components, such as processors and memory for executing programming or instructions and for storing calibration information as described herein, can be incorporated into other types of devices. Such devices include, but are not limited to, surveillance systems, automotive sensors, scientific instruments, medical instruments, machine vision sensors, etc.

The diffraction elements 524 within the diffraction element layer 520 of a pixel 104 can be configured as cylindrical elements. Alternatively or in addition, the diffraction elements can be provided as linear elements each having a longitudinal extent that is disposed radially about a center point of an associated pixel 104. In accordance with embodiments of the present disclosure, every set of diffraction features 520 can be identical to one another. The color filters 536 can be configured as areas of various shapes. For instance, the color filters 536 can be square, rectangular circular, octagonal, or any other shape. Moreover, the color filters 536 in a given set of color filters 532 can all be of the same shape and size, or can include a variety of shapes and size. In addition, the color filters 536 within a set of color filters 532 can each transmit a different range of wavelengths. Alternatively, some of the color filters 536 within a set of color filters 532 can transmit the same range of wavelengths.

In accordance with other embodiments of the present disclosure, at least some of the sets of diffraction features 520 and sets of color filters 532 can be shifted according to a location of an associated pixel 104 within the array 108, such that a center point of the pattern coincides with a chief ray angle of incident light at that pixel 104. In accordance with still other embodiments, different patterns or configurations of diffraction elements 524 and color filters 536 can be associated with different pixels 104 within an image sensor 100. For example, each pixel 104 can be associated with a different pattern of diffraction elements 524 and color filters 536. As another example, a particular diffraction element 524 and color filter 536 pattern can be used for all of the pixels 104 within all or selected regions of the array 108. As a further example, differences in diffraction feature or element 524 and color filter 536 patterns can be distributed about the pixels 104 of an image sensor 100 randomly. Alternatively or in addition, different diffraction element 524 and color filter 536 patterns can be selected so as to provide different focusing or diffraction characteristics at different locations within the array 108 of pixels 104. For instance, aspects of a diffraction element 524 and color filter 536 pattern can be altered based on a distance of a pixel 104 associated with the pattern from a center of the array 108. As can be appreciated by one of skill in the art after consideration of the present disclosure, different pixels 104 associated with different diffraction element 524 and color filter 536 arrangements require different calibrations, and must reference data obtained from their respective calibrations in recovering a spectrum of incident light.

In accordance with embodiments of the present disclosure, each of the diffraction elements 524 is transparent, and has an index of refraction that is lower or higher than an index of refraction of the substrate 112 in which the diffraction element 524 is formed. As examples, where the element substrate 552 is SiO2 with a refractive index n of about 1.46, the diffraction elements 524 disposed therein (e.g. the diffraction elements 524 in the first 524*a* and second 524*b* diffraction element layers) can be formed from SIN, TiO2, HfO2, Ta2O5, or SiC with a refractive index n of from about 2 to about 2.6. Where the image substrate is Si, the diffraction elements 524 disposed therein can be formed from SiO2.

Each color filter 536 can be a color filter as used in a CMOS image sensor. For any one pixel 104, the included color filters 536 occupy less than the entire photosensitive area of the pixel 104. In general, as the area of a pixel 104 covered by color filters 536 is increased the sensitivity of the pixel 104 is decreased, and the noise in the signals from the sub-pixels 604 is decreased. Conversely, as the area of a pixel 104 covered by color filters is increased, the sensitivity of the pixel 104 is increased, and the noise in the signals from the sub-pixels 604 is increased. Unlike prior art sensors having color filters, the color filters 536 in an image sensor 100 as disclosed herein are not configured so that each color filter 536 entirely occupies a corresponding photosensitive area of a pixel.

As previously noted, a set of diffraction features 520 and a set of color filters 532 is provided for each pixel 104. The diffraction elements 524 can be configured to focus and diffract incident light. The color filters 536 can be disposed to filter selected portions of the incident light before or after that light is diffracted by the diffraction elements 524.

Methods for producing an image sensor 100 in accordance with embodiments of the present disclosure include applying conventional CMOS production processes to produce an array of pixels 104 in an image sensor substrate 112 in which each pixel 104 includes a plurality of sub-pixels or photodiodes 604. As an example, the material of the sensor substrate 112 is silicon (Si), and each sub-pixel 604 is a photodiode formed therein. A thin layer of material or element substrate 552 can be disposed on or adjacent to a light incident side of the image sensor substrate 112. Moreover, the element substrate 552 can be disposed on a back surface side of the image sensor substrate 112. As an example, the element substrate 552 is silicon oxide (SiO2), and has a thickness of 400 nm or less. In accordance with the least some embodiments of the present disclosure, an antireflection layer or coating 544 can be disposed between the light incident surface of the image sensor substrate 112 and the element substrate 552. A set of diffraction features 520 and a set of color filters 532 is provided for each of the wavelength sensing pixels 104. The set of diffraction features 520 can be formed as transparent features disposed in multiple layers, including in layers configured as trenches formed in the element substrate 552, and other layers configured as trenches formed in the sensor substrate 112. For example, the diffraction elements 524 in the element substrate 552 can be formed from TiO2, and diffraction elements 524 in the sensor substrate 112 can be formed from SiO2. The diffraction elements 524 can be relatively thin (i.e. from about 100 to about 200 nm), and the pattern can include a plurality of linear diffraction elements 524 of various lengths disposed along lines that extend radially from a central area of a pixel 104. The color filters 536 can be formed as conventional, polymer based color filter elements. Moreover, an image sensor produced in accordance with embodiments of the present disclosure does not require micro lenses or color filters for each pixel.

The foregoing has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. A sensor, comprising:
a sensor substrate;
an element substrate, wherein the element substrate is disposed on a light incident surface side of the sensor substrate; and
a pixel disposed in the sensor substrate, wherein the pixel includes:
a plurality of sub-pixels;
a plurality of diffraction elements, wherein the diffraction elements are disposed in a first layer of the element substrate, wherein at least one of the diffraction elements partially overlaps more than one sub-pixel, and wherein the diffraction elements are asymmetrically disposed about an area of the pixel; and
a plurality of color filters, wherein the color filters are disposed in a second layer of the element substrate.

2. The sensor of claim 1, wherein the diffraction elements occupy less than all of an area of a light incident surface of the pixel.

3. The sensor of claim 2, wherein the color filters occupy less than all of an area of a light incident surface of the pixel.

4. The sensor of claim 2, wherein at least a first one of the diffraction elements is configured as a solid disc, and wherein a second one of the diffraction elements is configured as an open cylinder.

5. The sensor of claim 1, wherein the second layer of the element substrate is between the first layer of the element substrate and the light incident surface of the sensor substrate.

6. The sensor of claim 1, wherein the first layer of the element substrate is between the second layer of the element substrate and the light incident surface of the sensor substrate.

7. The sensor of claim 1, wherein each color filter in the plurality of color filters partially overlays at least first and second sub-pixels in the plurality of sub-pixels.

8. The sensor of claim 1, wherein each of the color filters is a same size.

9. The sensor of claim 1, wherein each of the color filters transmits a different range of wavelengths.

10. The sensor of claim 1, wherein each of the color filters is surrounded by a metal frame.

11. The sensor of claim 1, wherein the diffraction elements are transparent.

12. The sensor of claim 1, wherein the diffraction elements each have a refractive index that is higher than a refractive index of the substrate in which the diffraction elements are formed.

13. The sensor of claim 1, wherein at least some of the diffraction elements are different in size from one another.

14. The sensor of claim 1, further comprising:
an antireflective coating, wherein the antireflective coating is between the sensor substrate and the element substrate.

15. The second of claim 1, wherein a thickness of the element between 350 and 100 nm.

16. An imaging device, comprising:
an image sensor, including:
a sensor substrate;
an element substrate, wherein the element substrate is disposed on a light incident surface side of the sensor substrate; and
a plurality of pixels disposed in the sensor substrate, wherein each pixel in the plurality of pixels includes:

a plurality of sub-pixels;

a plurality of diffraction elements, wherein the diffraction elements are disposed in a first layer of the element substrate, wherein at least one of the diffraction elements partially overlaps more than one sub-pixel, and wherein the diffraction elements are asymmetrically disposed about an area of the pixel; and a plurality of color filters, wherein the color filters are disposed in a second layer of the element substrate.

17. The imaging device of claim 16, further comprising:

an imaging lens, wherein light collected by the imaging lens is incident on the image sensor, and wherein the diffraction elements diffract and scatter the incident light onto the sub-pixels of the respective pixels.

18. The imaging device of claim 16, further comprising:

a processor, wherein the processor executes application programming, wherein the application programming determines a color of light incident on a selected pixel from ratios of a relative strength of a signal generated at different pairs of sub-pixels of the selected pixel in response to the light incident on the selected pixel.

19. The imaging device of claim 16, wherein an area of the diffraction elements of any one of the plurality of pixels occupies less than all of a light incident surface of the any one of the pixels, and wherein an area of the color filters of the any one of the pixels occupies less than all of the light incident surface of the any one of the pixels.

20. A method, comprising:

receiving incident light at an image sensor having a plurality of pixels;

for each pixel in the plurality of pixels, diffracting using a set of diffraction elements and partially filtering using a plurality of wavelength filters the incident light onto a plurality of sub-pixels;

for each pixel in the plurality of pixels, determining a ratio of a signal strength generated by the sub-pixels in each unique pair of the sub-pixels in response to the incident light; and determining a color of the incident light at each pixel in the plurality of pixels from the determined ratio of signal strength at each of the sub-pixels.

\* \* \* \* \*